US006351116B1

(12) United States Patent
Bolda et al.

(10) Patent No.: US 6,351,116 B1
(45) Date of Patent: Feb. 26, 2002

(54) SYSTEM AND METHOD FOR ON-LINE HALL SENSOR PROGRAMMING

(75) Inventors: Daniel J. Bolda, New Berlin; Steven T. Haensgen, Oak Creek; John L. Scheele; Craig Muschinski, both of Greenfield, all of WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/410,106

(22) Filed: Sep. 30, 1999

(51) Int. Cl.[7] ................. G01R 35/00; G01R 31/00; G01R 33/07; G06F 11/00

(52) U.S. Cl. ............... 324/202; 324/22.5; 324/251; 324/601; 324/754; 702/104

(58) Field of Search ............... 324/202, 207.13, 324/207.2, 251, 252, 537, 754, 755, 765, 601, 225; 702/104, 90, 91; 327/511; 307/116–118; 73/1.01, DIG. 3

(56) References Cited

U.S. PATENT DOCUMENTS

| 5,087,874 A | * | 2/1992 | Robinson ............... 324/73.1 |
| 5,103,166 A | * | 4/1992 | Jeon et al. ........... 324/73.1 X |
| 5,610,530 A | * | 3/1997 | Whetsel .............. 324/73.1 X |
| 5,790,046 A | * | 8/1998 | Blossfeld ............ 324/207.2 X |

* cited by examiner

Primary Examiner—Gerard R. Strecker
(74) Attorney, Agent, or Firm—Robert A. Van Someren; Alexander M. Gerasimow; William R. Walbrun

(57) ABSTRACT

A system and method for programming a Hall effect sensor while the sensor is connected into the circuitry for a given application. The system includes a fixture for receiving the printed circuit board to which the sensor is mounted. A plurality of contacts, such as pogo pins, are arranged to contact the circuit board at desired pads that permit programming of the sensor, reduction of the voltage applied to the overall circuit during programming, and measurement of the sensor and circuit output. The system includes a voltage limiting circuitry that is electrically connected, via appropriate pogo pins, to the circuitry intermediate the subject sensor and potentially damaged circuit components.

17 Claims, 6 Drawing Sheets

SYSTEM AND METHOD FOR ON-LINE HALL SENSOR PROGRAMMING

FIELD OF THE INVENTION

The present invention relates generally to the programming of programmable sensors, and particularly to the programming of Hall effect sensors while the sensors are connected with other circuitry.

BACKGROUND OF THE INVENTION

A variety of sensors have parameters that are programmable by, for instance, applying momentary high voltage pulses to the sensor. The high voltage pulses effectively "burn" into the sensor the final, desired values of the parameters, e.g. gain.

For example, highly functional Hall effect sensors are available that have digitally programmable gains and offsets. The programming process is carried out by applying calibration signals which temporarily set the gain and offset at initial values, applying a known input, e.g., a magnetic field, to the Hall effect sensor and then measuring the output of the sensor or the output of a circuit to which the sensor is connected. This output is compared to an expected output. The sensor is then recalibrated with successive offsets and gains in an iterative manner until the expected output is obtained within a tolerance band. These final values may then be burned into a permanent memory of the Hall effect sensor, allowing the Hall effect sensor to retain the programmed values in the event of a power cycle.

Problems exist in programming such sensors whether the programming is done prior to connecting the sensor to a circuit or subsequent to connection of the sensor into a circuit. For example, if the sensor, e.g. Hall effect sensor, is programmed before being connected into a given circuit, any errors in the Hall effect sensor itself or in the installation of the sensor (e.g., tilt errors) can be considered additive to the rest of the circuit error to produce a total circuit error.

Potentially, the total circuit error can be reduced by programming the sensor after being mounted and connected to the applicable circuitry. Parameters, such as gain and offset, can be programmed to compensate for errors in the other circuitry. This results in a total circuit error that is much less than that obtained when programming the sensor prior to connection in the circuit. Because of the relatively high voltage pulses required to program the sensor, however, other circuit elements can be damaged if the programming is done after connecting the sensor into the circuit. For example, in many Hall effect sensor applications, the output of the Hall effect sensor is immediately presented to precision signal conditioning circuitry. This circuitry typically is sensitive to high voltages and may suffer a decrease in accuracy, or even destruction, if exposed to the high voltage pulses required for programming.

Accordingly, it would be advantageous to have a system and method for programming sensors, such as Hall effect sensors, after connecting the sensor into appropriate circuitry but without damaging sensitive elements of the circuitry.

SUMMARY OF THE INVENTION

The present invention features a method of programming a programmable sensor connected into a desired circuit. The method includes electrically connecting a programmable sensor into a circuit that is susceptible to damage by voltage pulses necessary to program the sensor. The method further includes adjusting parameters of the programmable sensor to compensate for potential errors in the circuit, and directing voltage pulses to the programmable sensor to permanently program a desired value for the parameter. The method further includes preventing the voltage pulse from damaging the circuit.

According to another aspect of the present invention, a method is provided for programming a programmable Hall effect sensor that is electrically connected into a circuit disposed on a printed circuit board. The method includes presenting a known input, such as a current or magnetic field to the programmable Hall effect sensor. The method further includes measuring a total output signal of the circuit, and iteratively adjusting at least one parameter of the programmable Hall effect sensor until the total output signal is within a tolerance band. The method further includes maintaining the programmed parameters at the desired values in the non-volatile memory of the Hall effect sensor. The method also includes protecting the circuit and its components from damage while the programming high voltage pulse is applied to the programmable Hall effect sensor.

According to another aspect of the present invention, a system is designed to facilitate the programming of a programmable device by a series of voltage pulses. The programming is performed while the device is electrically connected to a circuit having components that normally would be damaged by the pulses. The system includes a fixture having electrical contacts designed for conductive contact with the circuit intermediate the programmable device and a component susceptible to damage, such as an op amp. The system further includes voltage limiting circuitry electrically connected to the contacts to divert the voltage pulse and prevent component damage.

BRIEF DESCRIPTION OF THE DRAWINGS

The invention will hereafter be described with reference to the accompanying drawings, wherein like reference numerals denote like elements, and.

DETAILED DESCRIPTION OF THE PREFERRED EMBODIMENTS

The present invention relates to a system and method for programming certain sensors while those sensors are connected in a circuit having components that may be susceptible to damage during programming. A typical programmable sensor is programmed by relatively high voltage pulses that can be damaging to certain circuit components, such as op amps. The inventive system and method can be utilized with a variety of programmable sensors, however, a preferred programmable Hall effect sensor is described. In fact, in the subsequent description, one or more Hall effect sensors are described as mounted to a printed circuit board and electrically connected to appropriate circuitry for providing an appropriate output which corresponds to current in a conductor that passes through the core of the programmable Hall effect current sensor. The description of this preferred embodiment should not be construed, however, as limiting the scope of the claims to this specific type of programmable sensor.

Figure 1:
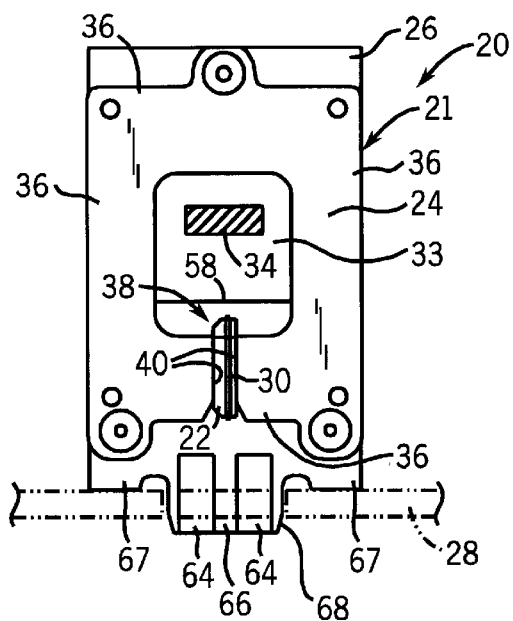
FIG. 1 is a front view of a sensor system incorporated into appropriate circuitry on a printed circuit board prior to programming the sensor, according to an exemplary embodiment of the present invention.
Figure 2:
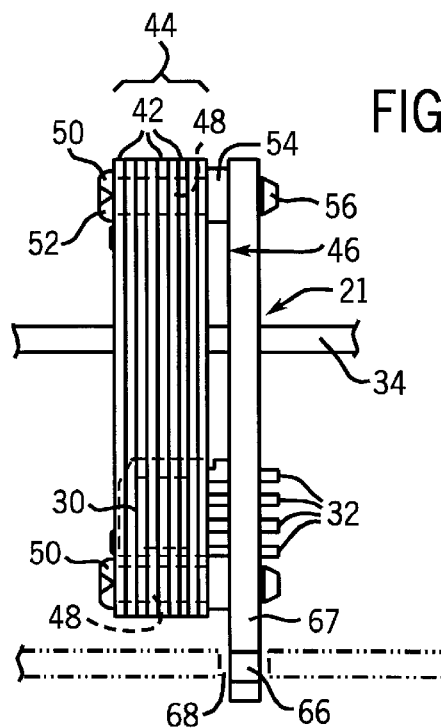
FIG. 2 is a side view of the system illustrated in FIG. 1.
Figure 3:
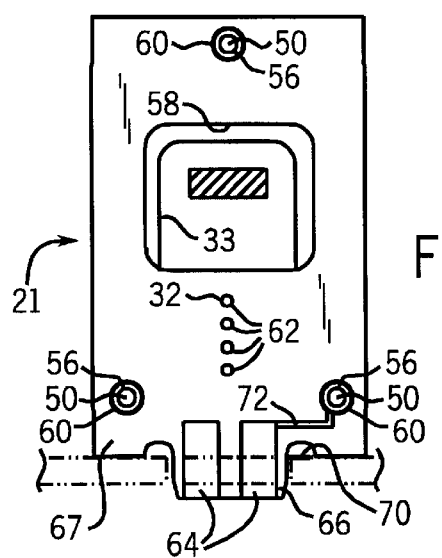
FIG. 3 is a rear view of the system illustrated in FIG. 1.

A preferred embodiment of a Hall effect sensor coupled to a printed circuit board in a manner that permits on-line programming of the programmable Hall effect sensor is described in FIGS. 1 through 5. Referring first to FIGS. 1 through 3, an exemplary embodiment of a sensor system 20 is illustrated. A preferred sensor system is a Hall effect current sensor system. As illustrated, the sensor system 20 includes a sensor module 21, having a sensor 22, such as a Hall effect sensor, a core 24, and a supporting printed circuit board 26 to which Hall sensor 22 and core 24 are mounted, and a primary circuit board 28 to which module 21 is mechanically and electrically connected. Specifically, printed circuit board 26 is mechanically and electrically connected to primary printed circuit board 28. Primary printed circuit board 28 is designed for the particular environment in which sensor system 20 is utilized. For example, sensor system 20 may be utilized in motor control environments, and specifically in relays designed to monitor current passing through one or more conductors.

Sensor 22 preferably is a Hall effect sensor that includes a Hall plate 30 and a plurality of leads 32 that are coupled to printed circuit board 26. Hall sensor 22 outputs a signal, and specifically a voltage signal, that corresponds to the magnetic flux in core 24, which is proportional to the current flowing through a conductor 34. The signal is output through appropriate leads 32.

In the illustrated embodiment, core 24 is formed as, but not limited to, a rectangular ring that defines a central opening 33 through which the conductor 34 passes. Current in conductor 34 creates a magnetic flux in core 24 and across a gap 38 that is sensed by sensor 22. As described above, a corresponding voltage signal is output through appropriate leads 32 as an indication of the current level in conductor 34.

In the exemplary embodiment illustrated, core 24 is generally, but not limited to, a rectangular shape, e.g. square, having four sides 36. The side 36 proximate primary printed circuit board 28 is interrupted by gap 38 sized to receive sensor 22 therein. Gap 38 is defined by a pair of core ends or core faces 40 that face one another across a space sufficient to receive Hall generator 22.

Preferably, core 24 is formed of a plurality of laminations 42 that are made from a ferrous-based material, such as high permeability nickel-iron. The laminations 42 are stacked to form a lamination stack 44 which is mounted to printed circuit board 26. Preferably, laminations 42 and printed circuit board 26 all lie generally parallel to a common plane.

Lamination stack 44 may be mounted to printed circuit board 26 in a variety of ways, but it preferably is spaced from printed circuit board 26 a predetermined distance indicated by reference numeral 46. In the illustrated embodiment, lamination stack 44 includes a plurality of openings 48 for receiving mounting pins or rivets 50 therethrough. For example, three pins 50 may be used to hold lamination stack 44 to printed circuit board 26. Each pin 50 maintains lamination stack 44 between a pin head 52 and a shoulder 54. Shoulders 54 are disposed between pin head 52 and the distal end 56 of each pin 50. The shoulders are designed to maintain distance 46 between lamination stack 44 and printed circuit board 26. The space helps prevent the lamination stack 42 from shorting the Hall sensor 22 to solder pads on the printed circuit board 26, and from wearing the solder mask. The space also facilitates centering of the Hall plate 30 within the core gap.

Printed circuit board 26 may be generally rectangular in shape and includes a central opening 58 that is generally aligned with central opening 33 of core 24. This allows conductor 34 to freely pass through central opening 33 of core 24 and central opening 58 of printed circuit board 26 without contacting either component. As illustrated, printed circuit board 26 generally is perpendicular to primary printed circuit board 28, and conductor 34 extends generally parallel with primary printed circuit board 28 as it passes through openings 33 and 58.

Circuit board 26 further includes a plurality of apertures 60 for receiving distal ends 56 of mounting pins 50. Distal ends 56 may be secured within aperture 60 by bonding, soldering or other techniques known to those of ordinary skill in the art. Printed circuit board 26 also includes a plurality of receptacles 62 for receiving leads 32 to form an electrical connection with Hall generator 22. It should be noted that receptacles 62 may take other forms, e.g. pads.

Additionally, printed circuit board includes a plurality of pads 64 by which leads 32 are electrically connected to primary circuit board 28. Leads 32 are connected to pads 64 through appropriate traces/circuits contained in circuit board 26.

Pads 64 are disposed on a circuit board tab 66 that extends outwardly from the remainder of circuit board 26. Tab 66 is designed for receipt in a corresponding opening 68 of primary circuit board 28 to create a mechanical connection that maintains circuit board 26 in a generally perpendicular orientation with respect to primary circuit board 28. Circuit board 26 also includes a pair of standoffs 67 adjacent tab 66 to maintain the core 24 at a given distance above primary circuit board 28. The distance helps avoid mechanical and electrical interference from components mounted on board 28.

Pads 64 are soldered to appropriate pads or connectors disposed in primary printed circuit board 28 to form the electrical connection between the two circuit boards. This type of connection is commonly referred to as a board-in-board connection by which the two circuit boards may be mechanically and electrically connected to one another. This arrangement provides a secure and durable connection even when sensor system 20 is utilized in relatively harsh, industrial environments subject to shock and vibration inputs.

The arrangement of components in the Hall effect current sensor system 20 is selected to minimize electrical noise that can affect the signal output by Hall sensor 22 and to provide a sturdy package for use in a wide variety of industrial applications. To reduce or eliminate the effects of noise on conductor 34, core 24 preferably is electrically connected to a ground 70. (See FIG. 3). Ground 70 can either be a protective "earth" ground or a circuit ground. For example, core 24 may be grounded through one of the pins 50 that is electrically connected to ground 70 via a trace 72 connected to an appropriate pad 64 which, in turn, is connected to ground 70.

The grounding of core 24 has no detrimental effects with respect to the magnetic properties or characteristics of the core 24. However, the grounding substantially reduces or eliminates the effects of electrical noise that can be capacitively coupled from conductor 34 to a floating core, such as core 24. Absent the grounding to ground 70, the electrical noise can be capacitively coupled to sensor 22 due to the significant amount of surface area that core end surfaces 40 have in parallel with Hall plate 30 of sensor 22.

Additionally, Hall plate 30 and Hall effect sensor 22 preferably are positioned such that they are relatively immune from direct electrical noise on either conductor 34 or primary printed circuit board 28. This is accomplished by positioning Hall plate 30 in a generally perpendicular orientation with respect to the electrical fields radiated from conductor 34 towards Hall sensor 22, as best viewed in FIG. 1. Preferably, Hall plate 30 also is disposed generally perpendicular to primary printed circuit board 28, and thus is less influenced by electrical fields created by various components that may be mounted on primary printed circuit board 28.

Furthermore, the accuracy of the voltage signal output through leads 32 is increased by properly locating Hall plate 30 with respect to core end surfaces 40. Specifically, it is preferred that Hall plate 30 be generally centered with respect to the surface area of core end surfaces 40. For example, Hall plate 30 is vertically centered with respect to surfaces 40, as illustrated in FIG. 1. Additionally, Hall plate 30 is axially centered with respect to surfaces 40, as illustrated in FIG. 2.

Figure 4:
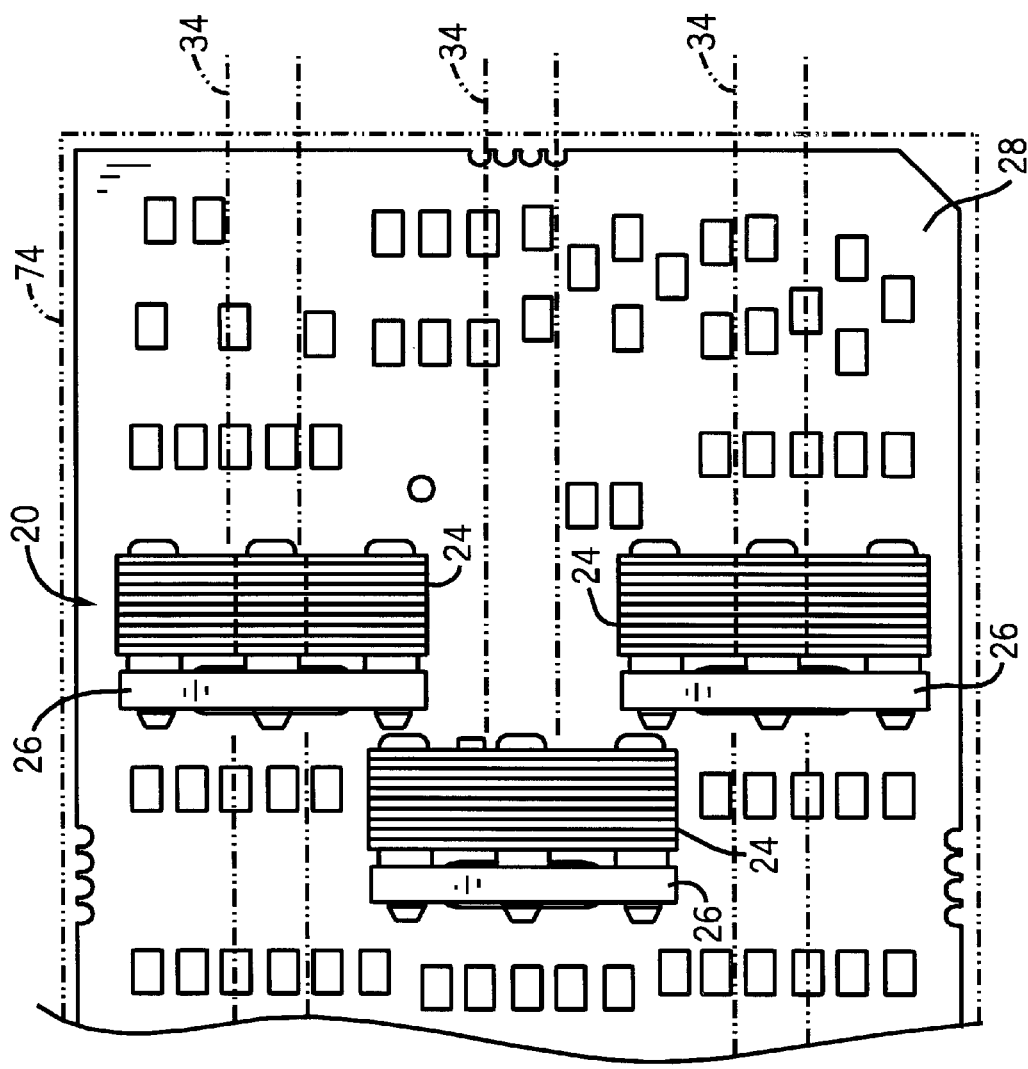
FIG. 4 is a top view of a system similar to that illustrated in FIG. 1 and designed with a plurality of exemplary sensors.
Figure 5:
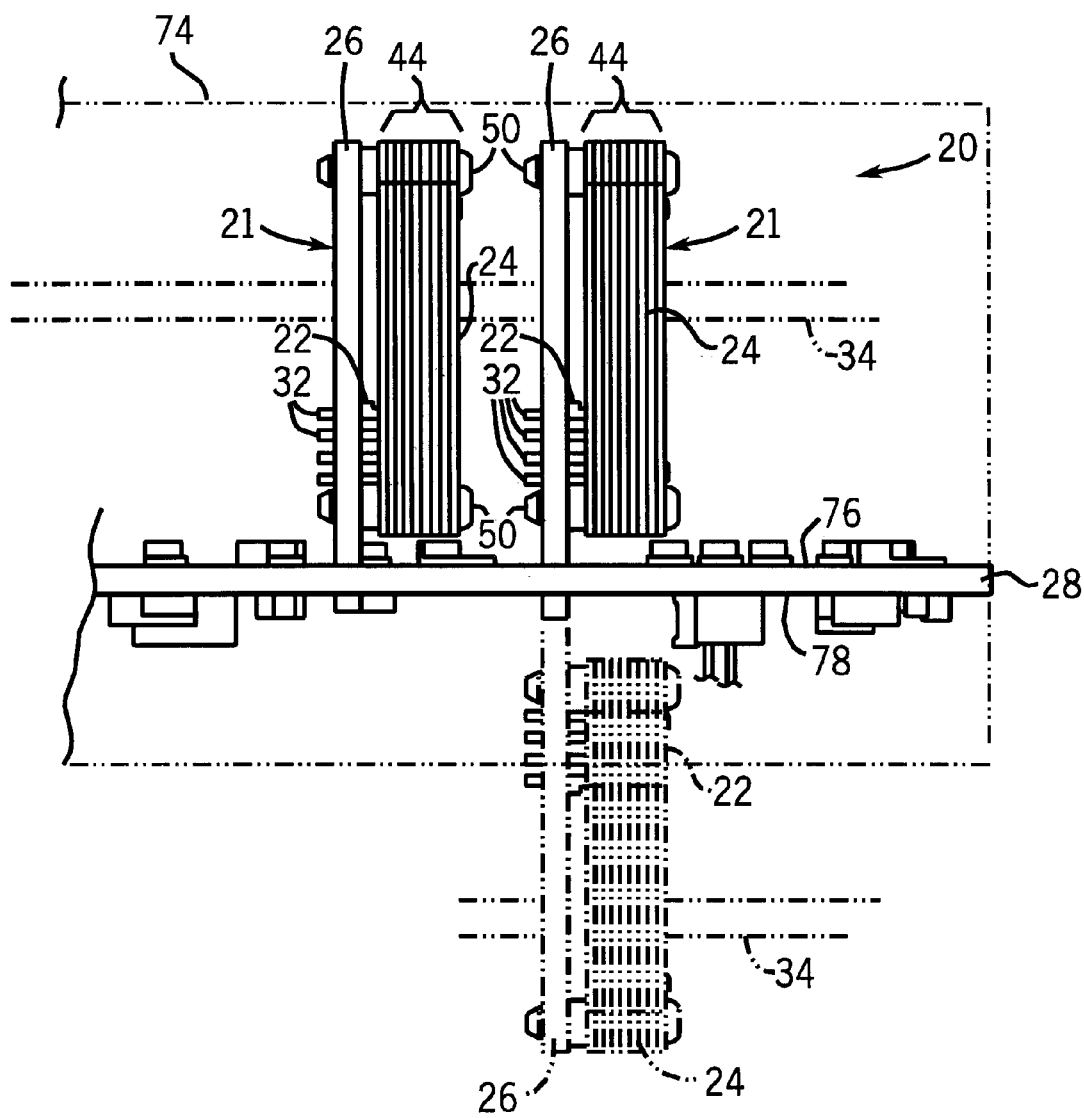
FIG. 5 is a side view of the system illustrated in FIG. 4.

Referring generally to FIGS. 4 and 5, sensor system 20 may include a plurality of cores 24 and sensors 22. For example, sensor system 20 may be utilized in a motor control component 74, such as a relay indicated in dashed lines in FIGS. 4 and 5. Such relays are used to automatically interrupt power or stop a given process if current flow through a conductor is abnormal. Such a relay typically is used in conjunction with a three-phase power supply in which three conductors 34 are used. In this system, a separate core 24, sensor 22, and printed circuit board 26 is used for each conductor 34.

The printed circuit boards may be arranged in staggered formation, as illustrated in FIG. 4, to more efficiently utilize the space within the outer housing of relay 74. Alternatively, the three printed circuit boards 26 can be combined as a single printed circuit board to which the three cores 24 and three sensors 22 are mounted. Another alternate arrangement is illustrated in FIG. 5 by phantom lines. In this configuration, one or more printed circuit boards 26 extend upwardly from an upper surface 76 of primary printed circuit board 28, and one or more printed circuit boards 26 extend downwardly from a lower surface 78 of primary printed circuit board 28.

Figure 6:
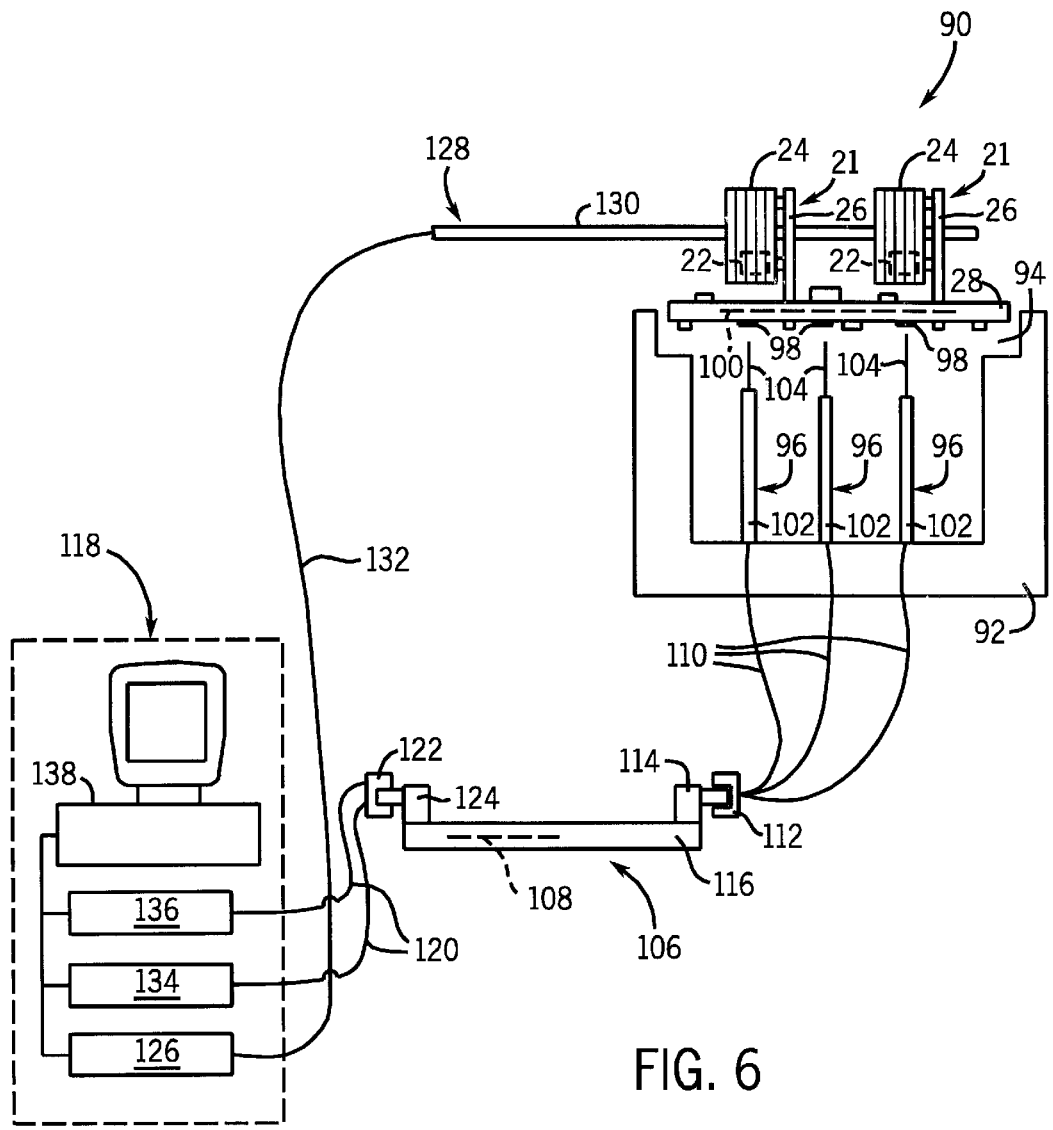
FIG. 6 is a system view showing the sensors mounted to a main printed circuit board, and the fixture intended for programming the sensors while connected to the appropriate circuitry on the printed circuit board.

Referring generally to FIG. 6, an exemplary embodiment of a programming system 90 is illustrated. Programming system 90 includes a fixture 92 having a recessed area 94 sized to receive primary printed circuit board 28. Fixture 92 also includes a plurality of electrical contacts 96 arranged to engage appropriate conductive pads 98 on printed circuit board 28. Some pads 98 are arranged to permit the transfer of voltage pulses for programming sensor 22. Other conductive pads 98, however, are electrically connected between each sensor 22 and components, e.g. op amps, susceptible to damage during the programming of the sensors 22. The programmable sensors 22 may be connected into a variety of circuits 100 having components susceptible to damage, as described more fully below.

Preferably, electrical contacts 96 comprise a plurality of pogo pins 102, each having a spring loaded contact tip 104 disposed to contact a corresponding pad 98. When primary printed circuit board 28 is pressed into recessed area 94, the appropriate pads 98 engage corresponding contact tips 104. The pogo pins 102 are connected to a programming module 106 in the form of a printed circuit board. Programming module 106 also includes a voltage limiting circuitry 108 to prevent damage to components of circuit 100 during the programming of Hall sensors 22.

Pogo pins 102 are connected to programming module 106 via a plurality of leads 110 coupled to a plug 112. Plug 112 is designed for mating engagement with a corresponding header 114 disposed on a printed circuit board 116 of programming module 106.

A programming station 118 also is coupled to programming module 106 via a plurality of leads 120 and a plug 122. Plug 122 is designed to engage a header 124 mounted on printed circuit board 116 of programming module 106.

When sensors 22 comprise Hall effect sensors, programming workstation 118 includes a current source 126 connected to a stab assembly 128 having conductors 130 arranged for insertion through the cores 24 of sensor modules 21. Current source 126 is connected to stab assembly 128 by one or more leads 132 to provide a current flow through Hall effect current sensors 22. An exemplary programming workstation 118 also includes a programmer 134, a voltage meter 136 for measuring output of circuit 100 and Hall effect sensor 22, and a controller 138, such as a personal computer. Personal computer 138 is coupled to voltage meter 136, programmer 134 and current source 126 to control the inputs to and monitor the outputs from programming module 106 and stab assembly 128.

It should be noted that a plurality of the pogo pins 102 are used in providing appropriate voltage signals and pulses to program a subject sensor 22. Other pogo pins 102 are utilized in making conductive contact with various points in the circuit 100 intermediate the sensor 22 and circuit components susceptible to damage by the voltage pulses used to program sensor 22. The voltage limiting circuitry 108 of programming module 106 ensures that the peak amplitude of the voltage is limited to a level that will not damage such components. This voltage limiting circuitry can include, but is not limited to, any low voltage suppression circuit or component, such as a diode, zener, or anti-parallel diodes.

An exemplary sensor is the Melexis High Precision Analog Sensor MLX90215 that may be programmed or calibrated by a Melexis procedure called "Programming Through the Connector". The exemplary sensor and procedure are available from Melexis Inc. located at 41 Locke Road, Concord, N.H., U.S.A.

Figure 7:
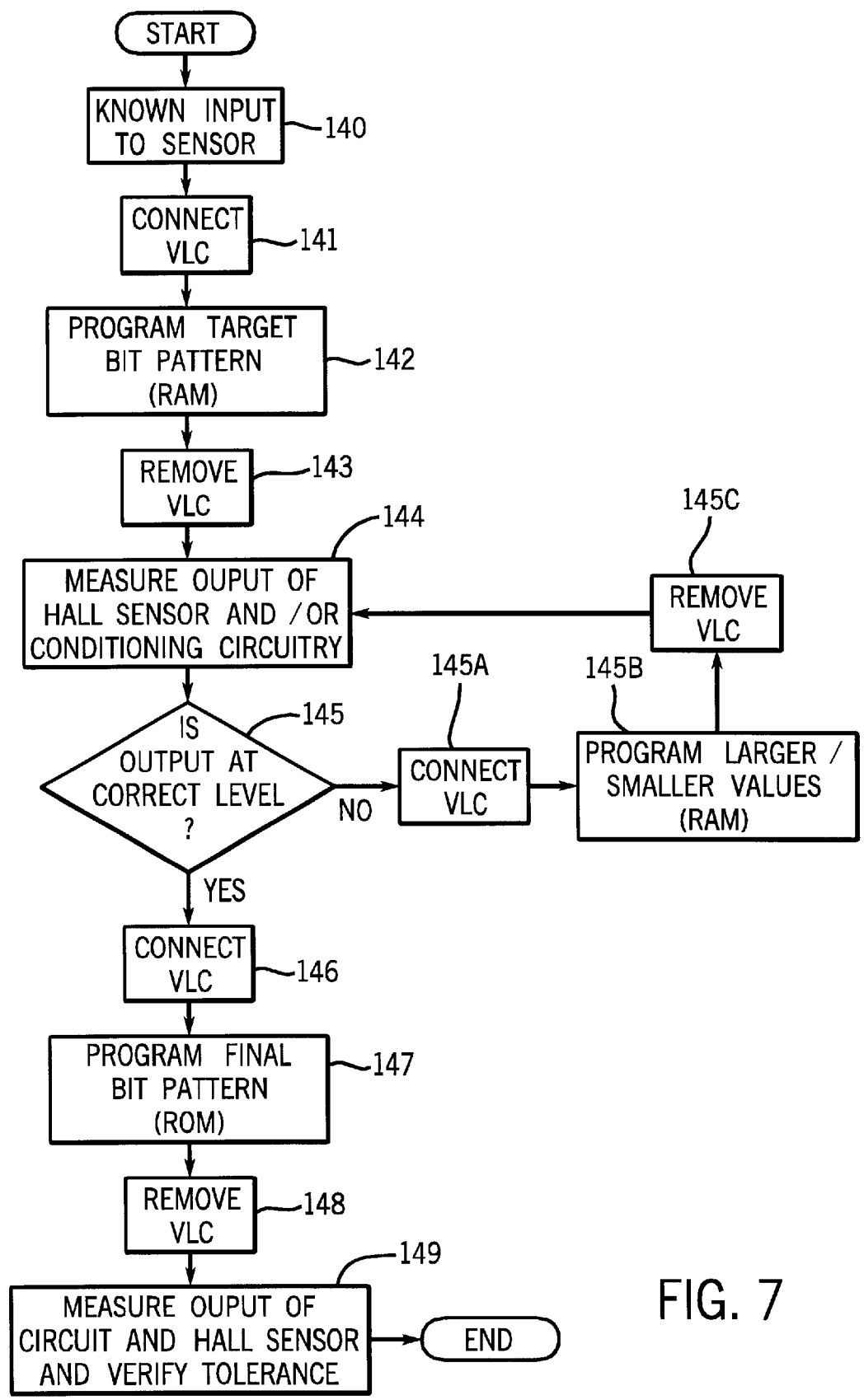
FIG. 7 is a flow chart illustrating the method of programming a programmable sensor, according to an exemplary embodiment of the present invention.

The programming of each Hall effect sensor 22 includes an iterative adjustment of one or more parameters, such as gain, offset, temperature coefficient, clamp level, invert slope, memlock and test modes, to compensate for errors in circuitry 100, as illustrated in the flow chart of FIG. 7. Initially, a known input is presented to the sensor, as illustrated in block 140. For example, with the Hall effect current sensors illustrated in FIG. 6, a known current is applied to stab assembly 128 to establish a known input, e.g. a magnetic field, that is presented to the subject Hall effect sensor 22.

After the known input is provided to the sensor, the voltage limiting circuitry 108 is electrically connected to the appropriate points of circuitry 100 (block 141), and the target bit pattern is programmed, as illustrated in block 142.

The voltage limiting circuit 108 is then removed (block 143), and the output of the Hall sensor and/or conditioning circuitry is measured, as illustrated in block 144.

At this point, it is determined whether the output of the Hall effect sensor and/or conditioning circuitry is at a correct level, as illustrated in block 145. If not, the voltage limiting circuit 108 is once again connected to circuitry 100 (block 145A), and appropriate larger or smaller values are programmed into the random access memory of the Hall effect sensor, as illustrated by block 145B. The voltage limiting circuit is then removed (block 145C), and the output of the Hall sensor and/or conditioning circuitry is measured as described at block 144. A determination is again made whether the output is at a correct level (block 145).

If the output is at a correct level, the voltage limiting circuit 108 is again connected with circuitry 100 (block 146), and the final bit pattern is programmed, i.e. burned, into read-only memory (ROM), as illustrated in block 147. The voltage limiting circuit is then removed (block 148), and the output of the circuit 100 and Hall effect sensor 122 is measured to verify that the output is within an acceptable tolerance band, as illustrated in block 149. The power is then removed, and the final values for the adjustable parameter is set, i.e., maintained by the sensor.

It should be noted that the exact iterative process may vary with the specific sensor and programming system. For example, the "Programming Through the Connector" procedure discussed above may work for certain sensors, while other procedures are more suited for differing brands or types of sensors.

Typically, this final "burn" process is accomplished by presenting the momentary, high voltage pulses to the appropriate pogo pins 102 utilized in programming a given sensor 22. These voltage pulses can be detrimental to various circuit components, as discussed above, even if those components are exposed to the high voltage for short durations. Accordingly, voltage limiting circuitry 108 is utilized to limit the exposure of those components to potentially damaging voltage.

Figure 8:
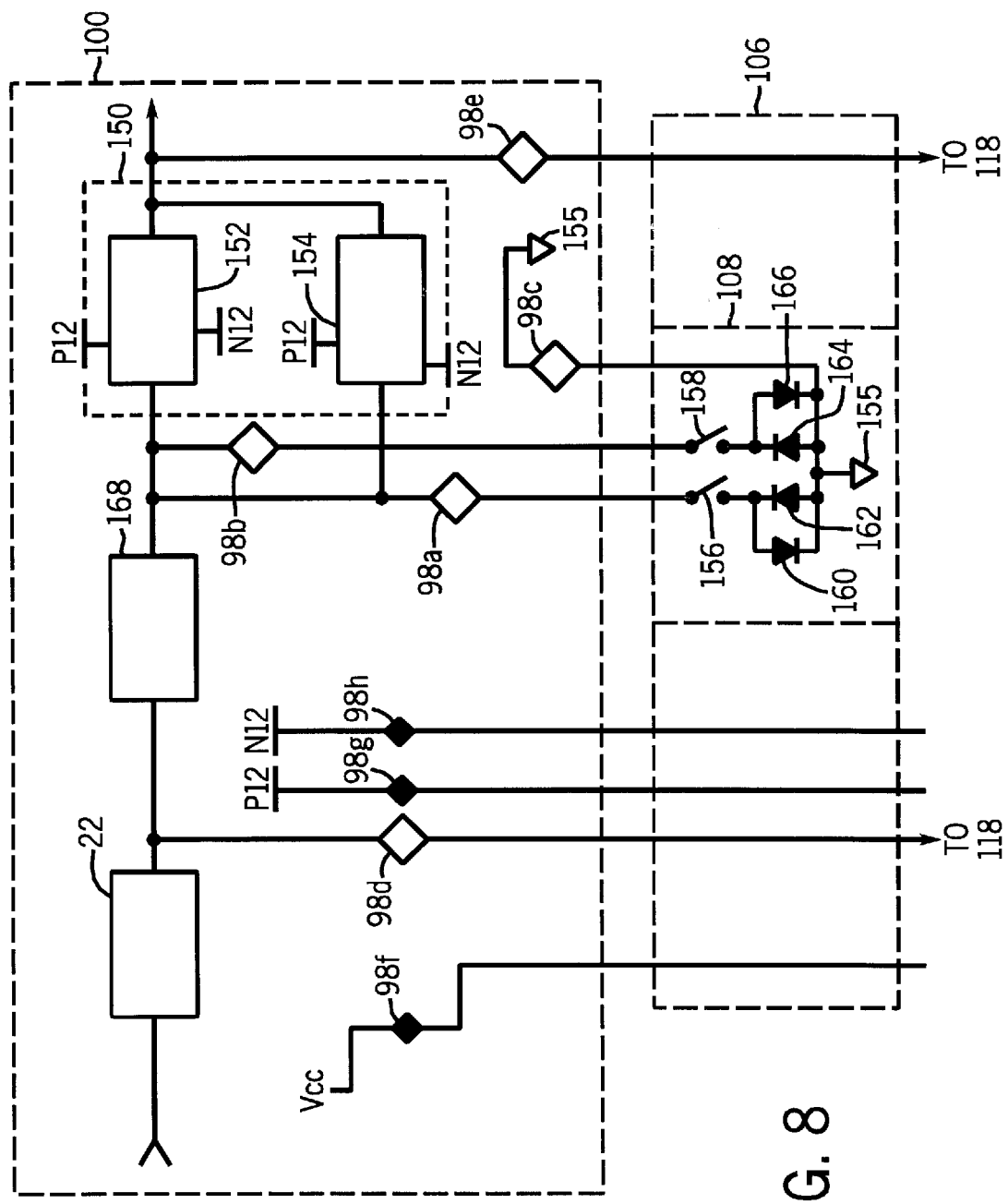
FIG. 8 is a schematic view of a module circuit used in protecting the components of the main printed circuit board illustrated in FIG. 6.

In the preferred embodiment, voltage limiting circuitry 108 comprises various components, as illustrated in FIG. 8, which are connected to circuit 100 via contact between appropriate pogo pins 102 (not shown in FIG. 8) and conductive pads 98 disposed intermediate the sensor being programmed and components subject to damage during the "burn" step of the programming. The various components and topologies are exemplary, and other components and topologies may be substituted as would be known to one of ordinary skill in the art.

Circuit 100 includes Hall effect sensor 22 and signal conditioning circuitry 150, which conditions the output signal generated by Hall effect sensor 22 in an appropriate manner for input to other circuit components of circuit 100, such as a microprocessor or an A/D converter. In the preferred embodiment illustrated, signal conditioning circuitry 150 includes an inverting amplifier 152 and a noninverting amplifier 154 to condition the output signal provided by Hall effect sensor 22. Op amps 152 and 154 may be damaged or destroyed by signals applied to their inputs which exceed a voltage threshold. For example, when Hall effect sensor 22 is finally programmed (i.e., the "burn" process), sensor 22 may generate a voltage pulse at its output on the order of approximately 24 volts. Because the supply voltage to op amps 152 and 154 is approximately 12 volts, a voltage signal applied to the inputs of op amps 152 and 154 which exceeds 12 volts (e.g. 24 volts) may damage or destroy the op amps.

Accordingly, voltage limiting circuitry 108 is provided in programming module 106 to limit the amplitude of the voltage signal that is applied to the inputs of op amps 152 and 154 during final programming of Hall effect sensor 22. The various components of voltage limiting circuitry 108 are electrically connected to signal conditioning circuitry 150 via conductive pads 98a and 98b. A common signal ground 155 for voltage limiting circuitry 108 and circuit 100 is provided via conductive pad 98c.

Voltage limiting circuitry 108 includes a switch 156, such as a relay switch, which is electrically connected to conductive pad 98a, and a switch 158, such as a relay switch, which is electrically connected to conductive pad 98b. The other end of switch 156 is connected to a voltage limiting device, such as a pair of anti-parallel diodes 160 and 162. Similarly, the other end of switch 158 is connected to a voltage limiting device, such as a pair of anti-parallel diodes 164 and 166. The opposite ends of diodes 160, 162, 164, and 166 are connected to the signal ground 155. Other potential voltage limiting components include zener diodes, transorbs, forward biased diodes etc., that can be used in place of the anti-parallel diodes.

Prior to applying the high voltage during final programming of Hall effect sensor 22, switches 156 and 158 are placed in a closed state, connecting diodes 160, 162, 164, and 166 to conductive pads 98a and 98b. Switches 156 and 158 can be closed, for example, by control signals (not shown) provided to voltage limiting circuitry 108 by programming workstation 118. When the relay switches 156 and 158 are in the closed position, the inputs to op amps 152 and 154 are clamped to signal ground 155 via diodes 160, 162, 164, and 166. Accordingly, the magnitude of the voltage that may be presented at the inputs of op amps 152 and 154 during final programming of Hall effect sensor 22 is limited to a specific voltage, in this case approximately one diode drop above or below signal ground 155. The specific voltage level is selected such that it is well within the safe operating range of the signal conditioning circuitry 150.

In the preferred embodiment illustrated in FIG. 8, circuit 100 also includes a current limiting impedance 168 electrically connected between the output of Hall effect sensor 22 and the input to signal conditioning circuitry 150. Impedance 168 is desirable to limit high peak currents that may be generated during final programming of Hall effect sensor 22 which could potentially damage signal conditioning circuitry 150. Accordingly, impedance 168 (e.g. a resistor) is sized to limit the peak current flow to a safe level. In the preferred embodiment of the invention, impedance 168 also is the input impedance of inverting op amp 152 which acts in conjunction with a feedback impedance (not shown) to set the gain characteristics of op amp 152. Accordingly, impedance 168 is sized both to set an appropriate gain for op amp 152, and to limit the amplitude of the current flow during final programming of Hall effect sensor 22.

During general testing of circuitry 100 and the iterative programming process of Hall effect sensor 22 (which occurs before the final "burn"), switches 156 and 158 are in an open condition in which diodes 160, 162, 164, and 166 are disconnected from the inputs of voltage conditioning circuitry 150. Relay switches 156 and 158 may be placed in the open condition by appropriate control signals (not shown) provided by programming workstation 118. Relay switches 156 and 158 are placed in the open condition to prevent interference by voltage limiting circuitry 108 with the normal operation of circuit 100.

Circuit 100 also includes conductive pads 98f, 98g and 98h which provide a supply voltage Vcc to Hall effect sensor 22 and a ±12 Vdc supply voltage (P12, N12) to conditioning circuitry 150. Supply voltages Vcc, P12, and N12 are provided by programming workstation 118 to power electronic devices (e.g., sensor 22, op amps 152 and 154, etc.) during testing of circuit 100 and final verification of the programmed Hall effect sensor 22.

Circuit 100 also includes conductive pads 98d and 98e which are electrically connected to the output of the Hall effect sensor 22 and the output of the signal conditioning circuitry 150, respectively. Appropriate pogo pins 102 contact conductive pads 98d and 98e to provide signals indicative of the output of the Hall effect sensor 22 and the output of the signal conditioning circuitry 150 during general testing of circuit 100, including the iterative programming process for Hall effect sensor 22.

It will be understood that the foregoing description is of a preferred exemplary embodiment of this invention and that the invention is not limited to the specific forms shown. For example, a variety of sensors may be utilized; a variety of programming techniques may be applied; the shape, size and configuration of the primary circuit board as well as its circuitry may be selected for a wide variety of applications; the fixture, electrical components and electrical contacts may be of different types or have other configurations; a variety of programming workstations may be available depending on the type of sensor to be programmed; and the programming module can be modified to accommodate different programming techniques and capabilities for a given sensor or sensors. These and other modifications may be made in the design and arrangement of the elements described above without departing from the scope of the invention as expressed in the appended claims.

What is claimed is:

1. A method of programming a programmable sensor connected into a desired circuit, comprising:
    electrically connecting a programmable sensor into a circuit susceptible to damage by a voltage level necessary to program the programmable sensor;
    adjusting a parameter of the programmable sensor to compensate for potential errors in the circuit;
    directing a voltage pulse to the programmable sensor to permanently program a desired value for the parameter while the programmable sensor is connected into the circuit; and
    preventing the voltage pulse from damaging the circuit by combining a voltage limiter with the circuit.

2. The method as recited in claim 1, wherein electrically connecting includes connecting a programmable Hall effect sensor into the circuit.

3. The method as recited in claim 2, wherein adjusting parameters comprises adjusting a Hall effect sensor gain.

4. The method as recited in claim 3, wherein adjusting parameters comprises adjusting a Hall effect sensor offset.

5. The method as recited in claim 2, wherein electrically connecting includes soldering a plurality of Hall effect sensor leads to a circuit board containing a component of the circuit, and connecting an exposed conductive pad between the programmable Hall effect sensor and component.

6. The method as recited in claim 5, wherein preventing includes placing a voltage limiting circuitry in contact with the conductive pad to limit the voltage applied to the one or more circuit elements during programming of the programmable Hall effect sensor.

7. The method as recited in claim 6, wherein placing the voltage limiting circuitry comprises mounting the circuit board in a fixture.

8. The method as recited in claim 7, wherein placing the voltage limiting circuitry further comprises connecting the voltage limiting circuitry in series with a current limiting impedance.

9. The method as recited in claim 1, further comprising a current limiting impedance with the voltage limiting circuit.

10. The method as recited in claim 1, further comprising electrically connecting and disconnecting the voltage limiting circuit during adjustment of the parameter.

11. A method for programming a programmable Hall effect sensor that is electrically connected into a circuit disposed in a printed circuit board, comprising:
    presenting a known input to the programmable Hall effect sensor;
    measuring a total output signal of the circuit;
    iteratively adjusting at least one parameter of the programmable Hall effect sensor until the total output signal is within a tolerance band;
    programming the programmable Hall effect sensor to maintain the at least one parameter at a desired value; and
    protecting the circuit from damage caused by excess voltage during programming.

12. The method as recited in claim 11, wherein presenting includes presenting a magnetic field to the programmable Hall effect sensor.

13. The method as recited in claim 11, wherein iteratively adjusting includes adjusting programmable Hall effect sensor gain values.

14. The method as recited in claim 11, wherein iteratively adjusting includes adjusting programmable Hall effect sensor offset values.

15. The method as recited in claim 11, wherein programming includes applying high voltage pulses to the programmable Hall effect sensor to burn in the desired value.

16. The method as recited in claim 11, wherein protecting includes connecting voltage sensitive elements of the circuit to conductive pads, and utilizing a voltage limiting circuitry placed in contact with the conductive pads to limit the voltage that would otherwise have been applied to the voltage sensitive elements.

17. The method as recited in claim 16, wherein iteratively adjusting includes electrically connecting and disconnecting the voltage limiting circuitry with the conductive pads during a plurality of iterations.

* * * * *